(12) United States Patent
Seeley et al.

(10) Patent No.: US 8,912,792 B2
(45) Date of Patent: Dec. 16, 2014

(54) SYSTEMS AND METHODS FOR ROTOR ANGLE MEASUREMENT IN AN ELECTRICAL GENERATOR

(75) Inventors: Nicholas C. Seeley, Pullman, WA (US); Charles L. Ramiller, Austin, TX (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 259 days.

(21) Appl. No.: 13/594,269

(22) Filed: Aug. 24, 2012

(65) Prior Publication Data

US 2014/0055126 A1    Feb. 27, 2014

(51) Int. Cl.

| G01B 7/14 | (2006.01) |
|---|---|
| G01B 7/30 | (2006.01) |
| G01R 33/06 | (2006.01) |
| H01L 43/06 | (2006.01) |
| G01R 21/00 | (2006.01) |
| G01D 5/347 | (2006.01) |

(52) U.S. Cl.
CPC .............. G01R 21/00 (2013.01); G01D 5/3473 (2013.01)
USPC .................................. 324/207.2; 324/207.22

(58) Field of Classification Search
CPC ....... G01D 5/00; G01D 5/3473; G01R 21/00; H03M 2201/4125; H03M 2201/4115; G01B 7/30; H02H 7/06
USPC ............... 324/207.11, 207.13, 207.2, 207.22, 324/251; 250/231.13, 231.14, 231.17
See application file for complete search history.

(56) References Cited

U.S. PATENT DOCUMENTS

| 3,921,047 A | 11/1975 | Carter |
|---|---|---|
| 4,142,591 A | 3/1979 | Himmelstein |
| 4,228,396 A | 10/1980 | Palombo |
| 4,229,694 A | 10/1980 | Wilson |
| 4,450,403 A | 5/1984 | Dreiseitl |
| 4,463,306 A | 7/1984 | de Mello |
| 4,506,339 A | 3/1985 | Kuhnlein |
| 4,766,370 A | 8/1988 | Carr |
| 4,991,429 A | 2/1991 | Stacey |

(Continued)

OTHER PUBLICATIONS

Demetrios A. Tziouvaras, Daqing Hou, Schweitzer Engineering Laboratories, Inc., Out-Of-Step Protection Fundamentals and Advancements, Jan. 1, 2003.

(Continued)

*Primary Examiner* — Tung X Nguyen
*Assistant Examiner* — Raul Rios Russo
(74) *Attorney, Agent, or Firm* — Jared L. Cherry

(57) ABSTRACT

Disclosed herein are systems and methods for rotor angle measurement in an electrical generator. According to one embodiment, an intelligent electronic device may comprise control logic configured to generate a reference signal and to generate a rotational position signal based upon an indicator of a rotational position of a rotor in an electrical generator. The control logic may further be configured to detect a relative shift between the reference signal and the rotational position signal and to determine the rotational position of the rotor based upon the relative shift. A power angle of the electrical generator may be calculated based upon the rotational position of the rotor. According to certain embodiments, the control logic may further be configured to generate a control instruction to reduce the power angle in response to determining that the power angle exceeds a threshold.

24 Claims, 7 Drawing Sheets

(56) References Cited

U.S. PATENT DOCUMENTS

| | | | |
|---|---|---|---|
| 5,537,322 A | 7/1996 | Denz | |
| 5,541,488 A | 7/1996 | Bansal | |
| 5,793,750 A | 8/1998 | Schweitzer | |
| 6,245,066 B1 * | 6/2001 | Morgan et al. | 606/41 |
| 6,476,521 B1 | 11/2002 | Lof | |
| 6,642,700 B2 | 11/2003 | Slade | |
| 6,662,124 B2 | 12/2003 | Schweitzer | |
| 6,845,333 B2 | 1/2005 | Anderson | |
| 6,934,654 B2 | 8/2005 | Benmouyal | |
| 6,947,264 B2 | 9/2005 | Gill | |
| 6,947,269 B2 | 9/2005 | Lee et al. | |
| 7,285,949 B2 | 10/2007 | Burns | |
| 8,248,060 B2 | 8/2012 | Schweitzer | |
| 8,248,061 B2 | 8/2012 | Schweitzer | |
| 8,674,683 B2 | 3/2014 | Schweitzer, III | |
| 2002/0033052 A1 | 3/2002 | Kondo | |
| 2006/0100819 A1 | 5/2006 | Grant | |
| 2009/0089608 A1 * | 4/2009 | Guzman-Casillas | 713/340 |
| 2009/0091303 A1 * | 4/2009 | Schweitzer et al. | 322/99 |
| 2010/0320763 A1 * | 12/2010 | Li et al. | 290/44 |
| 2011/0231171 A1 * | 9/2011 | Jousselin | 703/7 |
| 2011/0240628 A1 * | 10/2011 | Goretti et al. | 219/270 |
| 2011/0260042 A1 | 10/2011 | Schweitzer, III | |
| 2012/0313490 A1 | 12/2012 | Schweitzer, III | |

OTHER PUBLICATIONS

GMM, Optical Pick-Up (OPU) Specifications & Hook-Up, Oct. 3, 1995.

Encoder Design Guide, Optical Encoder Design and Operation, Nov. 11, 2004.

Optical Encoder Design and Operation, Apr. 1, 2005.

Patent Cooperation Treaty, International Search Report PCT/2008/079228, Dec. 8, 2008.

Patent Coperation Treaty, Written Opinion of the International Searching Authority PCT/2008/079228, Dec. 8, 2008.

Stephen Petronic, Optical Rotary Encoder Basics, Design News for Mechanical and Design Engineers, Apr. 22, 2002.

Zhou Jie, Zhang Daonong, Yu Yuehai, Wu Jingtao, Zhou Ji, Bi Tianshu, Xiong Ming, Rotor Position Measurement Method for Generator Power Angles, 2011 The International Conference on Advanced Power System Automation and Protection, Oct. 16, 2011.

PCT/US2013/056271, Patent Cooperation Treaty, International Search Report and Written Opinion of the International Searching Authority, Feb. 10, 2014.

* cited by examiner

SYSTEMS AND METHODS FOR ROTOR ANGLE MEASUREMENT IN AN ELECTRICAL GENERATOR

TECHNICAL FIELD

This disclosure relates to systems and methods for monitoring an angular position of a rotor in an electrical generator or an electrical motor, and calculating a power angle using a reference signal. This disclosure also relates to the use of a calculated power angle in a power system for control, automation, and/or protection. Further, this disclosure relates to the use of a calculated power angle to determine parameters associated with a model of an electrical generator.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1A:
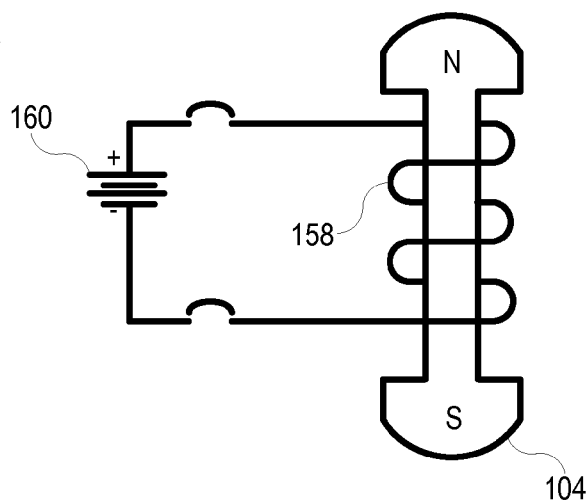
FIG. 1A illustrates a conceptual diagram of a rotor of a synchronous generator consistent with embodiments disclosed herein.

Information about the power angle (sometimes referred to as a rotor angle) of a generator in an electric power system is beneficial for providing appropriate power system control, automation, and protection. A power angle, as the term is used herein, refers to an angle between the axis of a generator rotor and a resultant magnetic field axis. Information about the power angle may be utilized in decisions regarding power generator levels, load shedding or adding, islanding, joining electrical networks, and so forth. Changes to an electrical generation and delivery system may drive a generator to instability for certain conditions of the power angle of the particular generator. As a result, to maintain stability, information concerning the power angle of a generator is important in the protection, automation, and control of an electrical generation and delivery system.

The power angle may be determined, according to some embodiments, by using a time source (e.g., a common or reference time source) to generate a reference signal that is compared to a rotational position signal. The rotational position signal may be obtained using a tooth wheel coupled to the shaft of the electrical generator. Alternatively, individual phases of the terminal voltage may be compared with the reference signal to detect a relative phase angle. A shift between the reference signal and the rotational position signal may be analyzed in order to determine the power angle of the electric generator. Some embodiments disclosed herein may incorporate a variable reluctance sensor (also known as a magnetic pickup unit or MPU) positioned with a pole piece in proximity to the teeth of a tooth wheel. As the teeth move past the pole piece, a periodic frequency voltage may be induced in a coil wrapped around the pole piece. A corresponding signal generated by the MPU may be used to determine a rotor angle in various embodiments.

Certain embodiments disclosed herein may allow for a determination of a rotor position using a tooth wheel having teeth disposed thereon that are substantially uniform. An output signal generated by a tooth wheel having uniform teeth may be indistinguishable based on the angular position of the tooth wheel. In other words, the angular position of the tooth wheel cannot be determined from the output signal alone when the wheel has uniform teeth. Various embodiments disclosed herein may allow for use of the tooth wheels having teeth disposed thereon that are substantially uniform. Accordingly, such systems and methods disclosed herein may be used in connection with existing generators having tooth wheels in which each of the teeth are substantially uniform. Embodiments in which the teeth of a tooth wheel are not substantially uniform (e.g., because one of the teeth has been ground down, or because the spacing between the teeth is not uniform) may also be utilized in connection with the systems and methods disclosed herein.

According to other embodiments, the power angle of an electrical generator may be determined by using a terminal voltage of one or more phases as a reference signal and comparing the terminal voltage to an output signal of an MPU. As the generator is loaded, torque increases with mechanical input to balance the opposing electrical force. The position of the tooth wheel relative to the terminal voltage may be monitored since the tooth wheel is mechanically coupled to the rotor shaft. The relative change between a loaded condition and a no-load condition may be used in calculating a power angle associated with the generator.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures could be arranged and designed in a wide variety of different configurations.

Several aspects of the embodiments described and illustrated may be implemented as software modules or components. As used herein, a software module or component may include any type of computer instruction or computer executable code located within a memory device and/or any other suitable medium or device. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer (or other electronic device) to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Electric generators are used in electrical power networks to provide electric power to the electrical network. Several types of generators may be used, most of which include a rotor that is rotated by a mechanical force or prime mover provided by, for example, wind flow, water flow, steam flow, torque from an engine, and/or the like. One particular type of generator is a synchronous generator. Synchronous generators are used in electric utility systems to convert mechanical rotation into alternating electric current. After suitable conditioning, the alternating electrical current is typically transmitted and distributed to a variety of power system loads within an electric network.

FIG. 1A illustrates a conceptual diagram of a rotor 104 of a synchronous generator consistent with embodiments disclosed herein. A rotor 104 may be driven by an external torque (not shown) to induce an electromagnetic field (EMF) in a stationary stator (e.g., stator 153 illustrated in FIG. 1B). The rotor 104 includes a field winding 158 wrapped around a rotor body, and the stator includes an armature winding wrapped around an armature body. A direct current is made to flow in the field winding 158 (using, for example, an exciter voltage 160) to generate a magnetic field in the rotor 104. Additionally or alternatively, permanent magnets may also be used.

Figure 1B:
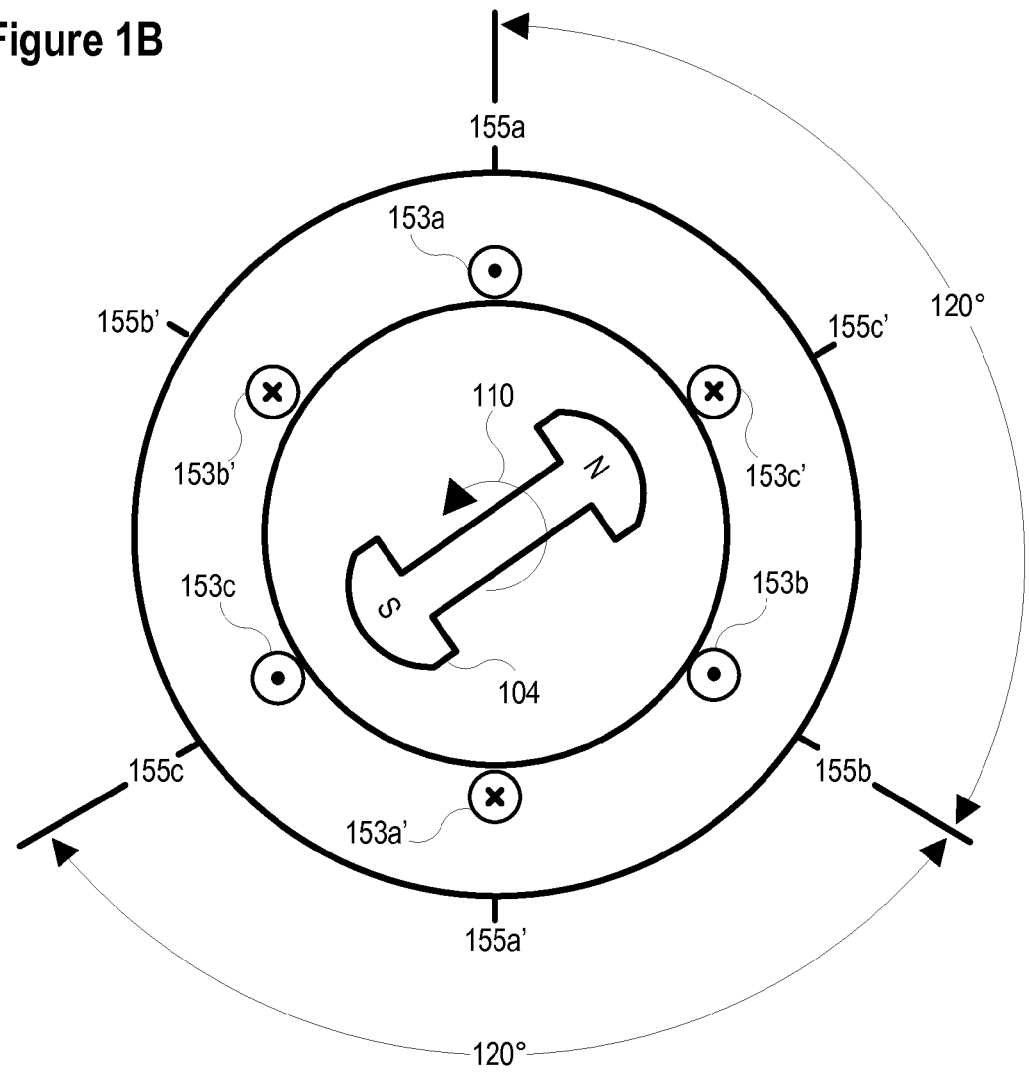
FIG. 1B illustrates a conceptual diagram of the rotor illustrated in FIG. 1A and a stator, which together may operate as a synchronous generator.

FIG. 1B illustrates a 3-phase synchronous generator that includes three sets of stator windings 153a to 153a', 153b to 153b', and 153c to 153c' consistent with embodiments disclosed herein. The stator windings are each separated by 120° such that when an electrical field associated with the rotor 104 passes, the electrical currents induced in terminal pairs 155a and 155a', 155b and 155b', and 155c and 155c' are each separated by 120 electrical degrees. When the rotor 104 rotates, as indicated by arrow 110, the magnetic field rotates with it, passing the stator windings and inducing a time-varying electric current therein. As the poles of the electrical field associated with the rotor 104 pass the stator windings, the voltage present on the corresponding terminals oscillates, and an alternating current results. Thus, the angular position of the rotor 104 is related to the time-varying electrical output of the terminals 155a-c. As described below, this relationship can be influenced by, for example, an electrical load connected to the terminals of the generator.

The period ($T_I$) of the resulting alternating current from a synchronous generator with N poles, and which has a period of rotation of $T_G$, can be calculated using the formula:

$$T_I = NT_G \qquad \text{Eq. 1}$$

Embodiments disclosed herein may be applied to any rotor regardless of the number of phases or pairs of poles included therein.

The position of the generator rotor axis is a function of a mechanical power input on the generator and an opposing electrical torque attributed to the electric output from the generator. These opposing forces result in a torque on the rotor. In a steady state condition (i.e., normal operating conditions) these forces are equal in magnitude but opposite in direction. In conditions where the mechanical torque and the electrical torque fall out of balance, the power angle may shift or oscillate, depending on the magnitude and nature of the imbalance.

Figure 2:
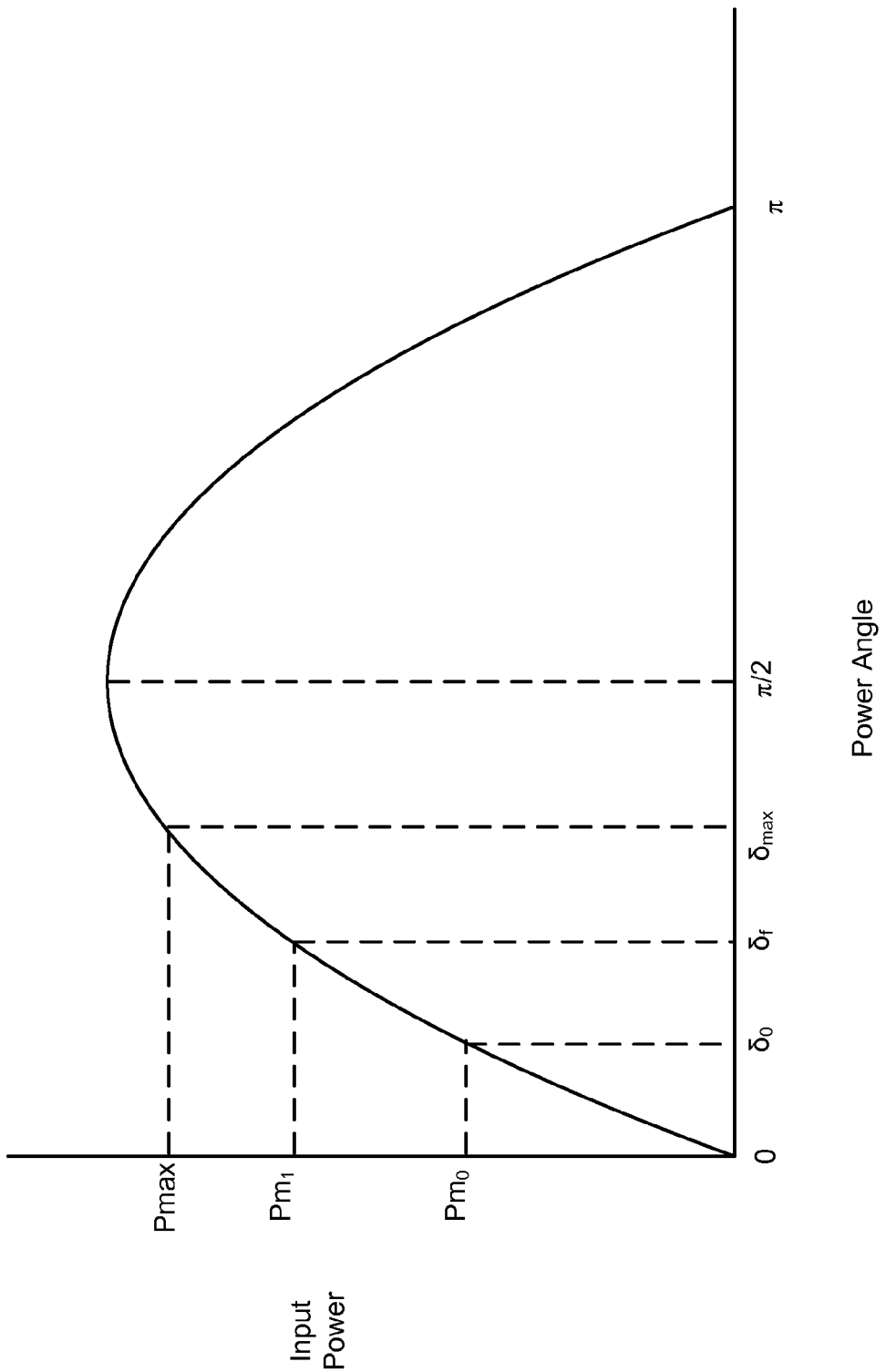
FIG. 2 is a power angle curve for an exemplary power generator.

FIG. 2 is one illustration of a power angle curve that shows the relationship between a power angle ($\delta$) and an input mechanical power ($P_m$). Under balanced conditions, input mechanical power $P_m$ results in equilibrium with the electrical energy drawn from the generator. When the electric torque that balances the mechanical torque decreases (i.e., as a result of an increase in the mechanical power input or a decrease in the electrical load attached to the generator), the rotor rotates at an increased rate, thus causing the power angle to increase. For example, in FIG. 2, the mechanical power may increase to $P_{m1}$ from $P_{m0}$, resulting in an increase in the power angle from $\delta_0$ to $\delta_f$. In a stable system, the rotor would experience negative acceleration, and eventually come into equilibrium. If the power input exceeds a maximum power input threshold, $P_{max}$, the generator may become unstable. Knowing the maximum power angle, $\delta_{max}$, and the associated maximum power input threshold, $P_{max}$, allows an operator to determine how much power can be safely produced by a generator without causing the generator to become unstable.

Figure 3:
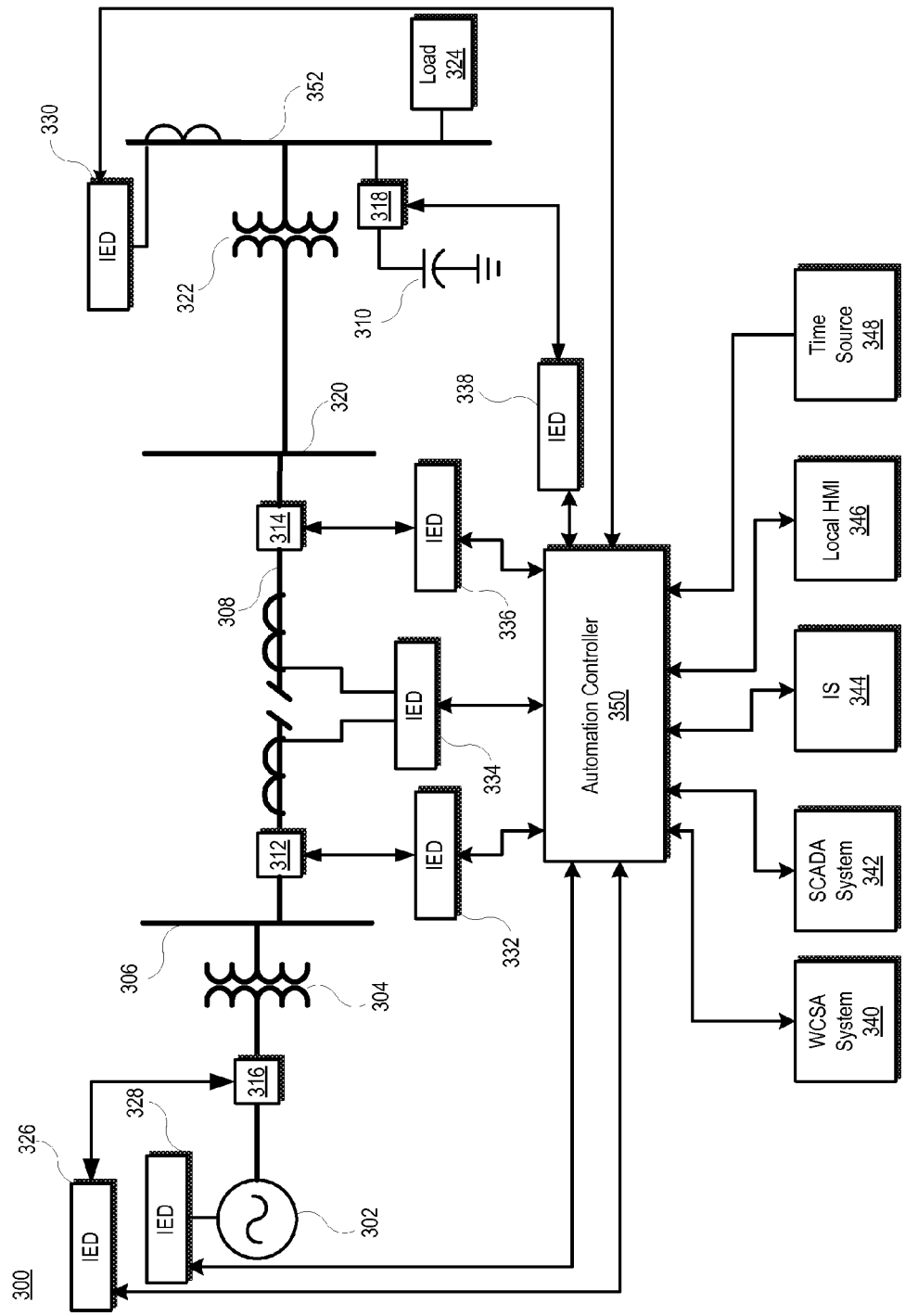
FIG. 3 illustrates a simplified diagram of an exemplary electric power generation and delivery system consistent with embodiments disclosed herein.

FIG. 3 illustrates a simplified diagram of an exemplary electric power generation and delivery system 300 consistent with embodiments disclosed herein. Particularly, systems and methods described herein may be applied and/or implemented in a system such as exemplary electric power generation and delivery system 300. The electric power generation and delivery system 300 may include, among other things, an electric generator 302, configured to generate an electrical power output, which in some embodiments may be a sinusoidal waveform. Although illustrated as a one-line diagram for purposes of simplicity, an electrical power generation and delivery system 300 may also be configured as a three-phase power system.

A step-up power transformer 304 may be configured to increase the output of the electric generator 302 to a higher voltage sinusoidal waveform. A bus 306 may distribute the higher voltage sinusoidal waveform to a transmission line 308 that in turn may connect to a bus 320. In certain embodiments, the system 300 may further include one or more breakers 312-318 that may be configured to be selectively actuated to reconfigure the electric power generation and delivery system 300. A step down power transformer 322 may be configured to transform the higher voltage sinusoidal waveform to a lower voltage sinusoidal waveform that is suitable for delivery to a load 324.

The IEDs 326-338, illustrated in FIG. 3, may be configured to control, monitor, protect, and/or automate the one or more elements of the electric power generation and delivery system. An IED may be any processor-based device that monitors, controls, automates, and/or protects monitored equipment within an electric power generation and delivery system (e.g., system 300). In some embodiments, the IEDs 326-338 may gather status information from one or more pieces of monitored equipment, including generator 302. Further, the IEDs 326-338 may receive information concerning monitored equipment using sensors, transducers, actuators, and the like.

FIG. 3 illustrates various IEDs 326-338 performing various functions for illustrative purposes and does not imply any specific arrangements or functions required of any particular IED. In some embodiments, IEDs 326-338 may be configured to monitor and communicate information, such as voltages, currents, equipment status, temperature, frequency, pressure, density, infrared absorption, radio-frequency information, partial pressures, viscosity, speed, rotational velocity, angular position, mass, switch status, valve status, circuit breaker status, tap status, meter readings, and the like. Further, IEDs 326-338 may be configured to communicate calculations, such as phasors (which may or may not be synchronized as synchrophasors), events, fault distances, differentials, impedances, reactances, frequency, and the like. IEDs 326-338 may also communicate settings information, IED identification information, communications information, status information, alarm information, and the like. Information of the types listed above, or more generally, information about the status of monitored equipment, may be referred to herein as monitored system data.

In certain embodiments, IEDs 326-338 may issue control instructions to the monitored equipment in order to regulate various aspects relating to the monitored equipment. For example, an IED (e.g., IED 336) may be in communication with a circuit breaker (e.g., breaker 314), and may be capable of sending an instruction to open and/or close the circuit breaker, thus connecting or disconnecting a portion of a power system. In another example, an IED may be in communication with a recloser and capable of controlling reclosing operations. In another example, an IED may be in communication with a voltage regulator and capable of instructing the voltage regulator to tap up and/or down. Information of the types listed above, or more generally, information or instructions directing an IED or other device to perform a certain action, may be generally referred to as control instructions.

IEDs 326-338 may be communicatively linked together using a data communications network, and may further be communicatively linked to a central monitoring system, such as a supervisory control and data acquisition (SCADA) system 342, an information system (IS) 344, and/or wide area control and situational awareness (WCSA) system 340.

Consistent with embodiments disclosed herein, IEDs 326-338 may be communicatively coupled with various points to the electric power generation and delivery system 300. For example, IED 334 may monitor conditions on transmission line 308. IEDs 326, 332, 336, and 338 may be configured to issue control instructions to associated breakers 312-318. IED 330 may monitor conditions on a bus 352. IED 328 may monitor and issue control instructions to the electric generator 302, while IED 326 may issue control instructions to breaker 316.

In certain embodiments, various components of the electrical power generation and delivery system 300 illustrated in FIG. 3 may be configured to monitor the power angle of generator 302. According to certain embodiments, IED 328 may be configured to monitor the power angle of generator 302. In other embodiments, information relating to the power angle of generator 302 may be calculated by other devices, such as automation controller 350. Further, two or more devices may jointly generate information relating to the power angle of generator 302.

In certain embodiments, communication between various IEDs 326-338 and/or higher level systems (e.g., SCADA system 342 or IS 344) may be facilitated by an automation controller 350. The automation controller 350 may also be referred to as a central IED or access controller. The IEDs 326-338 may communicate information to the automation controller 350 including, but not limited to, status and control information about the individual IEDs 326-338, IED settings information, calculations made by the individual IEDs 326-338 (e.g., the power angle of generator 302), event reports (e.g., a report relating to an electrical fault), communications network information, network security events, and the like. In some embodiments, the automation controller 350 may be directly connected to one or more pieces of monitored equipment (e.g., electric generator 302 or breakers 312-318).

The automation controller 350 may also include a local human machine interface (HMI) 346. In some embodiments, the local HMI 346 may be located at the same substation as automation controller 350. The local HMI 346 may be used to change settings, issue control instructions, retrieve an event report, retrieve data, and the like. The automation controller 350 may further include a programmable logic controller accessible using the local HMI 346.

The automation controller 350 may also be communicatively coupled to an external time source 348. In certain embodiments, the automation controller 350 may generate a time signal based on the time source 348 that may be distributed to communicatively coupled IEDs 326-338. Based on the time signal, various IEDs 326-338 may be configured to collect and/or calculate time-aligned data points including, for example, synchrophasors, and to implement control instructions in a time coordinated manner. As described in detail below, a common time signal provided by time source 348 may be used in order to calculate a power angle of generator 302.

The time signal provided by time source 348 may also be used by the automation controller 350 for time stamping information and data. Time synchronization may be helpful for data organization, real-time decision-making, as well as post-event analysis. The time source 348 may be any time source that is an acceptable form of time synchronization, including, but not limited to, a voltage controlled temperature compensated crystal oscillator, Rubidium and Cesium oscillators with or without a digital phase locked loop, microelectromechanical systems (MEMS) technology, which transfers the resonant circuits from the electronic to the mechanical domains, or a global positioning system (GPS) receiver with time decoding. In the absence of a discrete time source 348, the automation controller 350 may serve as the time source 348 by distributing a time synchronization signal.

To maintain voltage and reactive power within certain limits for safe and reliable power delivery, an electrical power generation and delivery system may include switched capacitor banks (SCBs) (e.g., capacitor 310) configured to provide capacitive reactive power support and compensation in high and/or low voltage conditions within the electrical power system.

Figure 4:
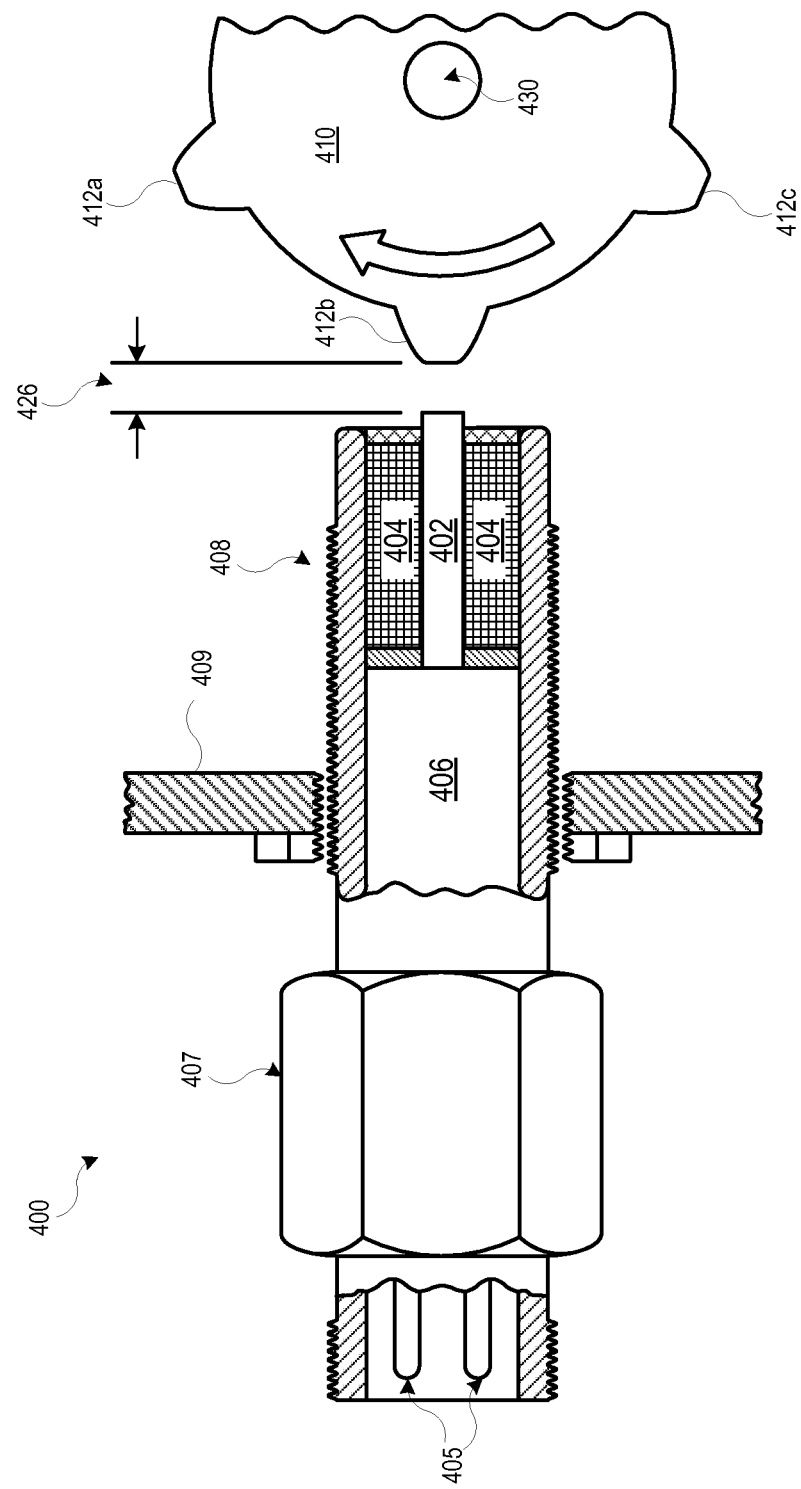
FIG. 4 illustrates a simplified partial cross-sectional view of a magnetic pickup unit (MPU) consistent with embodiments disclosed herein.

FIG. 4 illustrates a simplified partial cross-sectional view of an MPU 400 consistent with embodiments disclosed herein. MPU 400 is operable to track the passing of a plurality of teeth 412a-c associated with a tooth wheel 410 and may be utilized in connection with an electrical generator (not shown). A shaft connected to a rotor (not shown) of the generator may pass through aperture 430 of tooth wheel 410. MPU 400 includes a magnet 406, which in certain embodiments may be permanent, a pole-piece 402, a sensing coil 404, and a case 408. Case 408 may extend through a housing 409. An air gap 426 separates tooth wheel 410 from MPU 400. Coil 404 may be disposed around a pole-piece 402, which is disposed across air gap 426 from the plurality of teeth 412a-c. Pole piece 402 abuts permanent magnet 406. A connector 407 may be used to connect MPU 400 to an IED (not shown) or other device configured to monitor the power angle of a generator associated with MPU 400.

The passing of the plurality of teeth 412a-c in proximity to pole-piece 402 causes a distortion of the magnetic flux field passing through the sensing coil 404 and pole-piece 402, which in turn generates a signal voltage. In certain embodiments, tooth wheel 410 may be formed of ferrous material. The voltage induced in sensing coil 404 is proportional to the rate of change of flux in the magnetic field, where the rate of change of flux is determined by the size of the air gap 426, and the rotational velocity of the tooth wheel 410, as provided in Eq. 2.

$$\varepsilon = -N\frac{d\Phi}{dt} \qquad \text{Eq. 2}$$

In Eq. 2, $\varepsilon$ represents the voltage induced in the sensing coil 404, N represents the number of coil turns in the sensing coil 404, and $\Phi$ represents the flux in the magnetic field generated by permanent magnet 406. A plurality of leads 405 may be used to transmit the signal generated by MPU 400 to an IED or other device. The frequency of the induced voltage is proportional to the number of teeth on the wheel and the speed of rotation, according to Eq. 3.

$$\text{Frequency (Hz)} = \frac{\text{Number of Teeth} * RPM}{60} \qquad \text{Eq. 3}$$

Figure 5A:
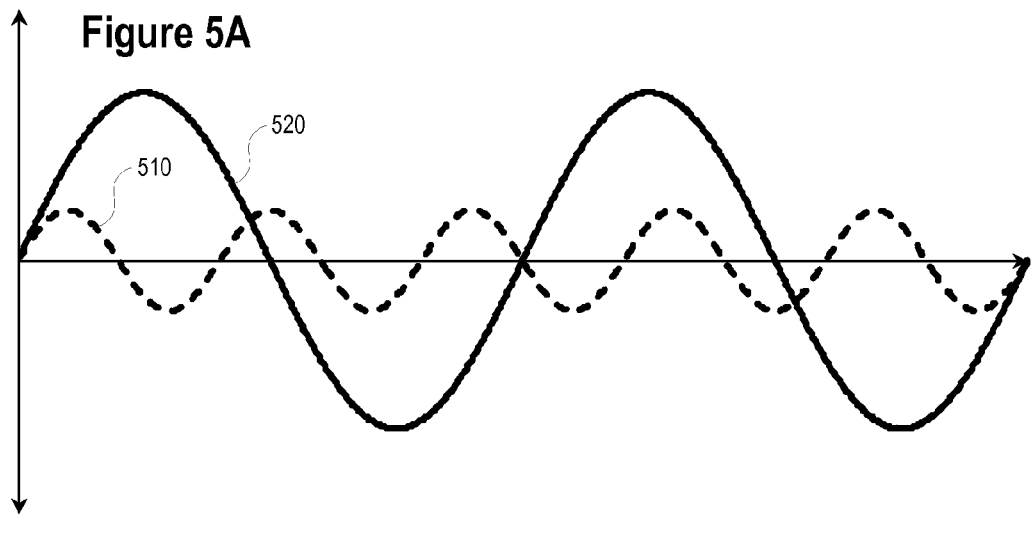
FIG. 5A illustrates an exemplary terminal output voltage and the output of an MPU in a generator operating in a no-load condition consistent with embodiments disclosed herein.

FIG. 5A illustrates a graph of an output 510 of an MPU and the terminal voltage 520 of one phase of a generator in a no-load condition. According to the embodiment illustrated in FIG. 5A, the output 510 of the MPU is generated by a tooth wheel having five (5) equally spaced teeth coupled to a four pole generator (i.e., a generator in which one complete revolution equals two cycles of the terminal voltage). Therefore two terminal voltage cycles equals one complete revolution of the tooth wheel on a four pole machine. Accordingly, the frequency of the terminal voltage 520 may be 60 Hz, and the frequency of the output of the MPU 510 may be 150 Hz.

While various embodiments disclosed herein generate a rotational position signal based on the output of an MPU, other embodiments may rely on a design that does not generate a rotational position signal based on the output of an MPU. For example, a rotational position system may count the teeth associated with a tooth wheel coupled to a rotor of a generator as the teeth pass by a sensor. The number of teeth on the tooth wheel is known, and accordingly, the rotational position system may determine the rotational position of the rotor by counting the teeth as they pass the sensor.

According to one embodiment in which there is one electrical cycle per revolution of the rotor (i.e., a 2-pole generator), when an equal number of teeth are counted by the sensor, the rotational position system may determine that one complete revolution of the rotor has occurred. The rotational position system may therefore generate a rotational position signal that may be compared to a reference signal in order to determine a relative shift between the signals. According to another embodiment, in which there are two electrical cycles per revolution of the rotor (i.e., a 4-pole generator), the rotational position system may generate a 2-cycle-per-revolution signal when each two on the tooth wheel has been counted.

Embodiments that generate the rotational position signal based on the approach of counting teeth on a tooth wheel may generate a rotational position signal that is the same frequency as the reference signal. Certain embodiments that generate a rotational position by counting the teeth on a tooth wheel may compute the power angle of a generator in the same manner as described in connection with other embodiments disclosed herein.

The output signal 510 of the MPU may be tracked relative to a reference signal to determine the angular position of the rotor. According to one embodiment, the reference signal comprises a phase of the terminal voltage of the generator. Such an embodiment is described in connection with FIG. 5B. According to another embodiment, the reference signal may comprise a signal matched to the nominal frequency of the tooth wheel and synchronized to a time reference. According to various embodiments, the time reference may be provided by a variety of sources, such as the Global Positioning System (GPS), an inter-range instrumentation group (IRIG) time reference, the WWV time signal from the National Institute of Standards and Technology (NIST), the WWVB time signal from the NIST, a local area network (LAN) time signal, or the like. FIG. 5C illustrates an embodiment that utilizes a time reference based signal to produce a reference signal.

Figure 5B:
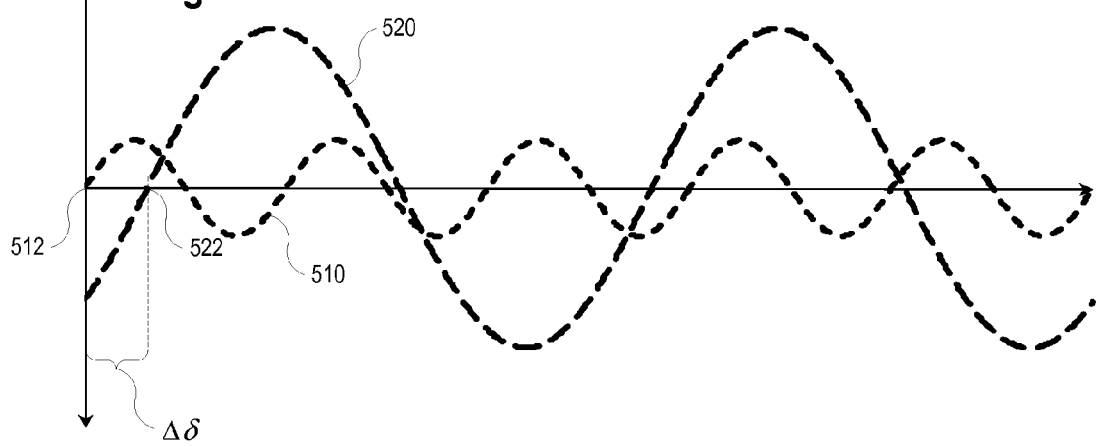
FIG. 5B illustrates an exemplary terminal output voltage and the output of an MPU in a generator operating in a loaded condition consistent with embodiments disclosed herein.
Figure 5C:
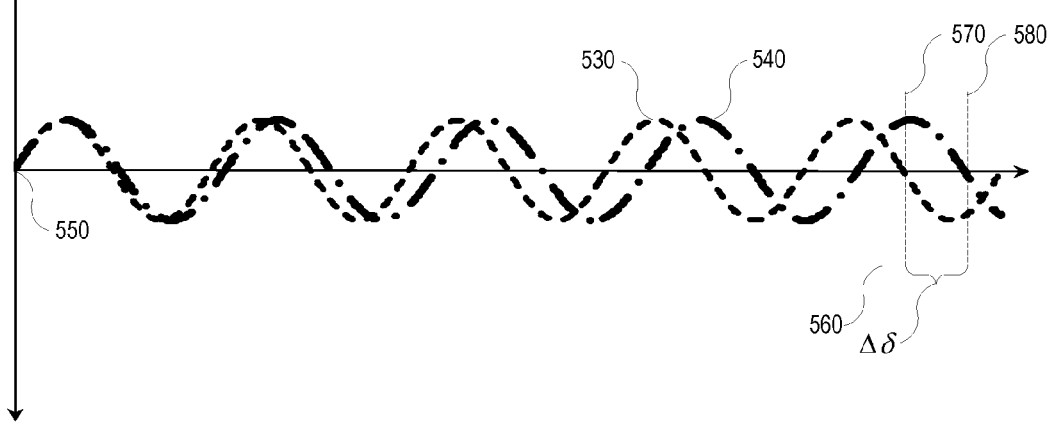
FIG. 5C illustrates an exemplary output of an MPU and a reference signal based upon an external time input, which may be utilized to calculate a power angle of a generator operating in a loaded condition consistent with embodiments disclosed herein.

FIG. 5B illustrates a graph of the output signal 510 of the MPU and the terminal voltage 520 in a loaded condition. As the generator is loaded, torque increases as mechanical input increases to balance the opposing electrical force. The position of the tooth wheel relative to the terminal voltage may be monitored since the tooth wheel is mechanically coupled to the rotor shaft. The relative change between the loaded condition and the no-load condition (i.e., as shown in FIG. 5A) may be used as a basis for calculating a power angle associated with the generator.

Given that the MPU produces a sinusoidal output proportional to the power system frequency, a zero crossing of the output signal 510 of the MPU can be marked relative to an individual phase of the terminal voltage in a no-load condition (i.e., as shown in FIG. 5A). For example, if the frequency of the output signal 510 of the MPU is X, every $2X^{th}$ zero crossing can then be measured relative to the same phase of the terminal voltage. Although the specific embodiment illustrated in FIG. 5A, shows a ratio of 5:2 between the output 510 of the MPU and the terminal voltage 520, in alternative embodiments the frequency of the sensor signal may be any ratio. Any change in the relative time between the MPU signal and the terminal voltage on the 2Xth measurement, as the machine is loaded, represents a change in relative rotor angle. In FIG. 5B, a zero-crossing of the output 510 of the MPU and the terminal voltage 520 of one phase of the generator are shown at 512 and 522, respectively. The shift between these two points, $\Delta\delta$, represents the position of the rotor relative to the terminal voltage 520. The reference position identified in the no-load condition (i.e., as shown in FIG. 5A) may be used to calculate the change in rotor position according to Eq. 4.

Rotor Position=Reference Position−Loaded position    Eq. 4

A no-load condition may be established, according to one embodiment by electrically disconnecting a generator from a load. For example, a breaker may be actuated to selectively disconnect a generator from a load in order to operate the generator in the no-load condition. According to another embodiment, an exciter voltage used to generate a magnetic field in the rotor may be temporarily removed. When the exciter voltage is removed, the rotor may not generate a magnetic field, and thus, no current may be induced in the stator as a result of movement of the rotor with respect to the stator. Such embodiments may provide a more accurate "no load" condition because circuitry downstream of the generator may have impedance. For example, electrical impedance may be attributable to the windings in the generator. The generator may have a "loss curve" that approximates the electrical losses of the generator from a no-load condition to a full load condition. The electrical losses in the generator may account for some change in rotor position with respect to the output voltage in the no-load condition. Accordingly, by determining the no-load condition by removing an exciter voltage, these losses may be taken into account when calculating a power angle in a loaded condition.

FIG. 5C illustrates an embodiment in which a constant reference signal 530 is generated and compared to an output signal 540 of an MPU over a span of time as the generator is loaded. FIG. 5C is merely illustrative, given that the loading of a generator generally would occur more slowly in practice than is illustrated in FIG. 5C. Constant reference signal 530 may be generated based on the frequency of the MPU output at a rated speed of the generator. The frequency of the MPU output at the rated speed of the generator may be calculated using Eq. 3. According to certain embodiments, the constant reference signal 530 may be generated using a time source, such as a GPS reference time. According to the illustrated embodiments, the load may increase from a first time 550 to a second time 560. At 550, a generator may be operating in a no-load condition, and at 560, the generator may be fully loaded. The angular position of the rotor may be determined by detecting a relative shift between the reference signal 530 and the output of the MPU 540.

According to one embodiment, the zero-crossings of each of signals 530 and 540 may be used to detect a relative shift between reference signal 530 and the output signal 540 of the MPU. A zero crossing of reference signal 530 is designated at 570, while a zero crossing of the output signal 540 of the MPU is designated at 580. A time difference, $\Delta\delta$, between zero crossings 570 and 580 may be determined. The relative time difference may be used to calculate the rotational position of the rotor.

Although the waveforms illustrated in FIG. 5A, FIG. 5B, and FIG. 5C are sinusoidal, alternative embodiments may rely other types of waveforms, such as a square wave. For example, in one embodiment, a Hall-Effect Sensor may be utilized in place of an MPU as a mechanism for detecting the passage of a plurality of teeth associated with a tooth wheel. The output signal in such embodiments may comprise a square waveform. In certain embodiments, such as those that utilize an approach of counting the passage of teeth associated with a tooth wheel, a square waveform may be advantageous.

Figure 6:
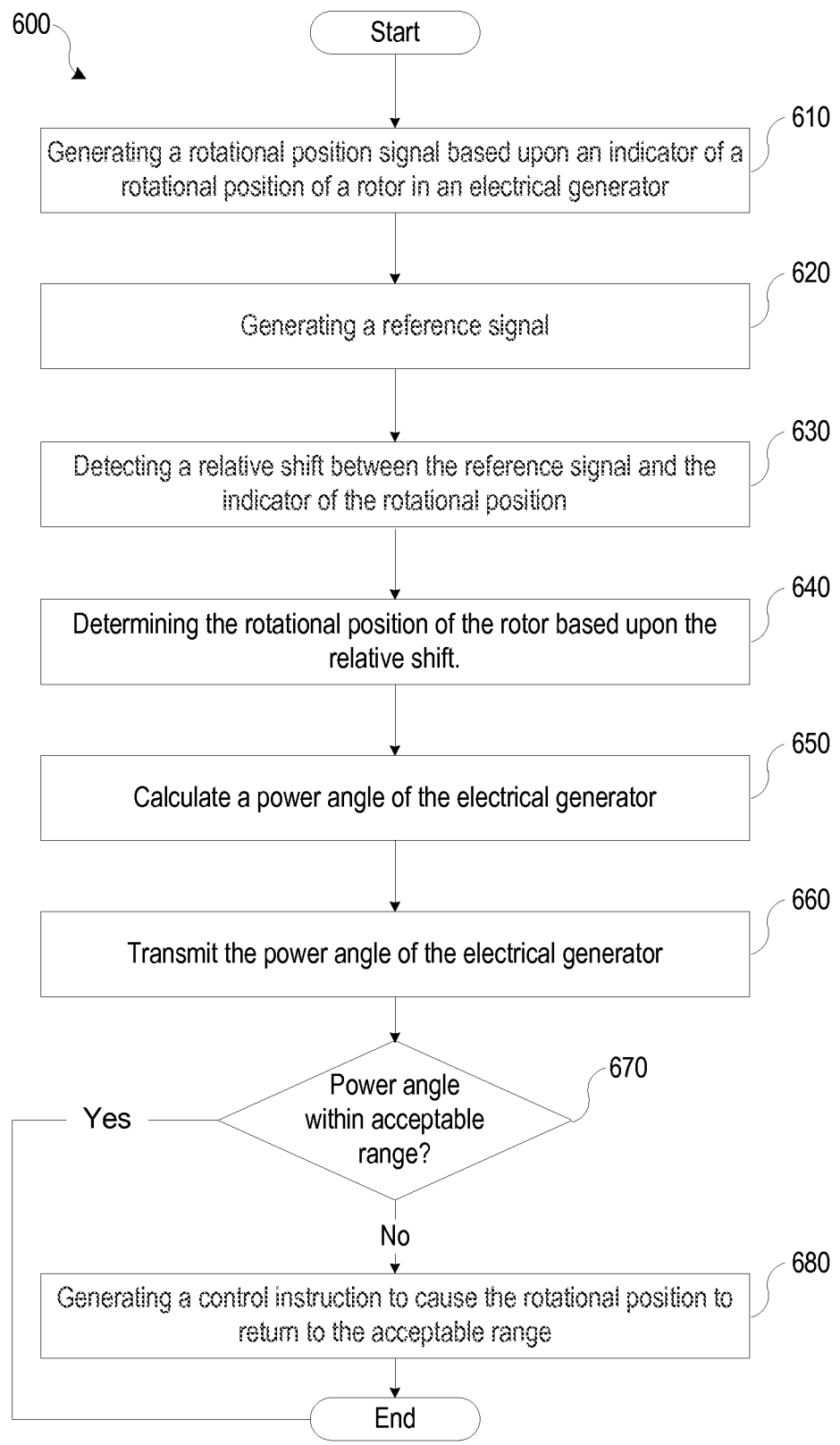
FIG. 6 illustrates a method of calculating a power angle of a generator consistent with embodiments disclosed herein.

FIG. 6 illustrates a flow chart of a method 600 for determining a rotational position of a rotor in an electrical generator. At 610, a rotational position signal based upon an indicator of a rotational position of a rotor in an electrical generator may be generated. According to certain embodiments, the indicator of the rotational position may comprise a tooth wheel coupled to the rotor of the electrical generator. Further, an MPU may be configured to detect the passage of a plurality of teeth disposed on the tooth wheel.

At 620, a reference signal may be generated. According to one embodiment, the reference signal may be based upon an external time signal, such as a GPS time signal. For example, the reference signal could be a signal matched to the nominal frequency of the tooth wheel and synchronized to the external time reference. According to another embodiment, the reference signal may comprise a terminal voltage of at least one phase of the generator.

The reference signal may be initiated when the generator is operating in a no-load condition. In the no-load condition, the power angle of the generator may be at a minimum (i.e., approximately 0). Accordingly, the reference signal may be aligned with the rotational position signal. According to embodiments in which the reference signal comprises a signal matched to a nominal frequency of a tooth wheel, the reference signal may be aligned with the output of an MPU monitoring the rotational position of the tooth wheel. According to embodiments in which the reference signal comprises the terminal voltage of one phase of the electrical generator, the reference signal may similarly be aligned with the output of the MPU.

At 630, a relative shift between the reference signal and the indicator of the rotational position may be determined. The relative shift between the reference signal and the indicator of the rotational position may be attributable to increasing the electrical load attached to the electrical generator. An increase in the mechanical energy applied to the input of the generator to produce additional electrical power may cause the rotational position signal to advance relative to the reference signal. Similarly, a decrease in the mechanical energy applied to the input of the electrical generator may cause the rotational position signal to retreat relative to the reference signal.

At 640, the rotational position of the rotor may be calculated based upon the relative shift between the reference signal and the indicator of the rotational position. The rotational position of the rotor may be expressed in terms of the power angle of the generator or in absolute terms (e.g., the angular position of the rotor). The rotational position of the rotor may be used to calculate a power angle of the electrical generator, at 650. The power angle of the electrical generator may be transmitted at 660 to a higher-level control system configured to coordinate the action of the electrical generator together with other components of an electrical power generation and delivery system.

According to certain embodiments, at 670, it may be determined whether the rotational position is within an acceptable range. As described above, to maintain stability, information concerning the power angle of the generator may be monitored, and appropriate control actions may be undertaken if it is determined that the rotational position is outside of an acceptable range.

At 680, a control instruction may be generated to cause the rotational position to return to the acceptable range if it is determined that the rotational position is not with in the acceptable range. For example, the control action may include an instruction to reduce the load connected to the generator (e.g., by load shedding). Further, the control action may include an instruction to increase generation capacity (e.g., by bringing additional generators online).

Figure 7:
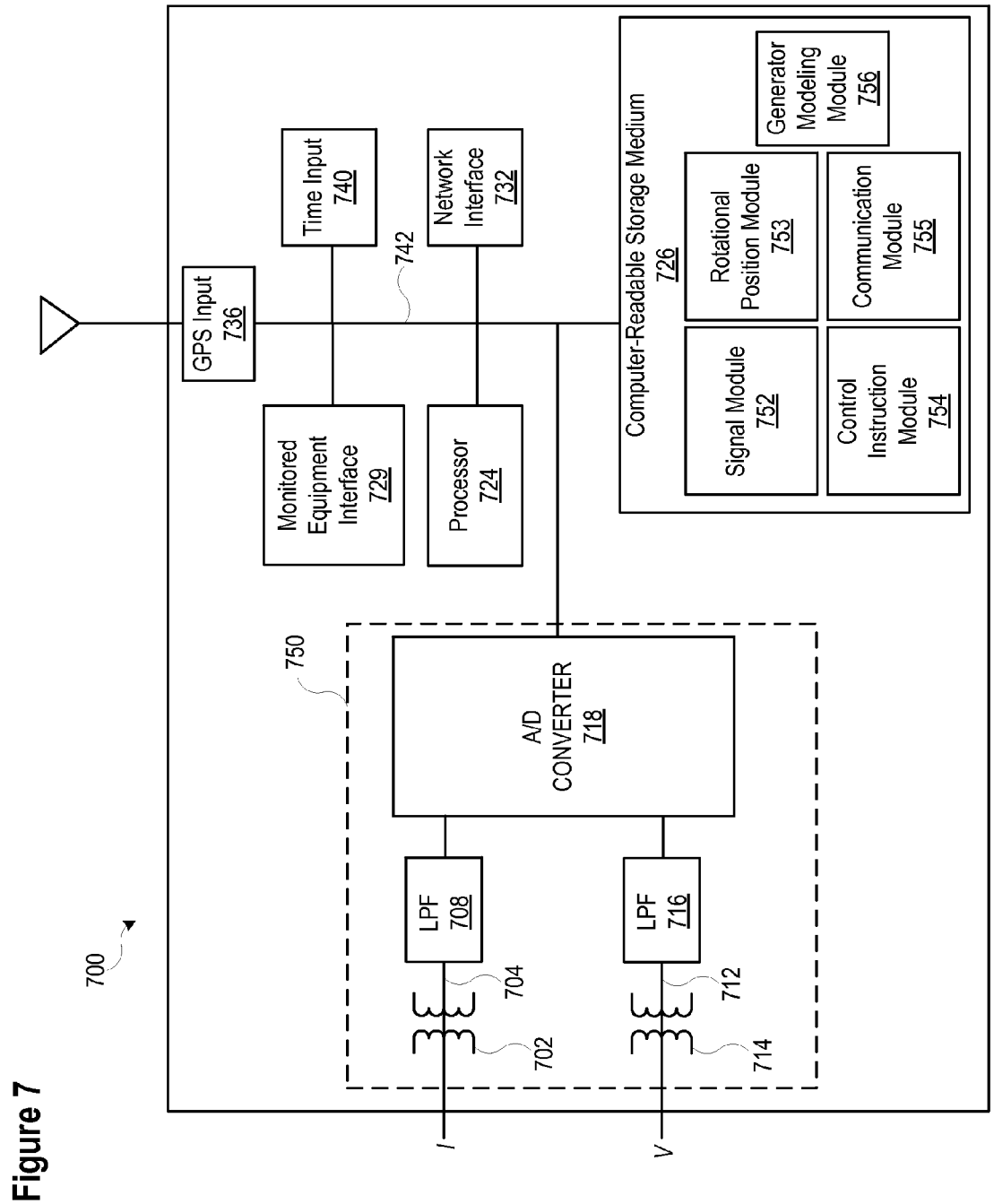
FIG. 7 illustrates a functional block diagram of an intelligent electronic device (IED) that may be utilized to calculate a power angle of a generator consistent with embodiments disclosed herein.

FIG. 7 illustrates an exemplary block diagram of an IED 700 configured to determine a rotational position of a rotor in an electrical generator consistent with embodiments disclosed herein. IED 700 includes a network interface 732 configured to communicate with a data network. IED 700 also includes a time input 740, which may be used to receive a time signal. In certain embodiments, time input 740 may be used to generate a reference signal, as described above. In certain embodiments, a common time reference may be received via network interface 732, and accordingly, a separate time input and/or GPS input 736 would not be necessary. One such embodiment may employ the IEEE 1588 protocol. Alternatively, a GPS input 736 may be provided in addition or instead of a time input 740.

A monitored equipment interface 729 may be configured to receive status information from, and issue control instructions to a piece of monitored equipment, such as an electrical generator. According to certain embodiments, the monitored equipment interface 729 may be configured to interface with an MPU and/or Hall-Effect sensor that generates a signal based upon the detection of the passage of one or more teeth associated with a tooth wheel coupled to a rotor in an electrical generator.

A computer-readable storage medium 726 may be the repository of one or more modules and/or executable instructions configured to implement any of the processes described herein. A data bus 742 may link monitored equipment interface 729, time input 740, network interface 732, GPS input 736, and computer-readable storage medium 726 to a processor 724.

Processor 724 may be configured to process communications received via network interface 732, time input 740, GPS input 736, and monitored equipment interface 729. Processor 724 may operate using any number of processing rates and architectures. Processor 724 may be configured to perform various algorithms and calculations described herein using computer executable instructions stored on computer-readable storage medium 726. Processor 724 may be embodied as a general purpose integrated circuit, an application specific integrated circuit, a field-programmable gate array, and other programmable logic devices.

In certain embodiments, IED 700 may include a sensor component 750. In the illustrated embodiment, sensor component 750 is configured to gather data directly from a conductor (not shown) using a current transformer 702 and/or a voltage transformer 714. Voltage transformer 714 may be configured to step-down the power system's voltage (V) to a secondary voltage waveform 712 having a magnitude that can be readily monitored and measured by IED 700. Similarly, current transformer 702 may be configured to proportionally step-down the power system's line current (I) to a secondary current waveform 704 having a magnitude that can be readily monitored and measured by IED 700. Low pass filters 708, 716 respectively filter the secondary current waveform 704 and the secondary voltage waveform 712. An analog-to-digital converter 718 may multiplex, sample and/or digitize the filtered waveforms to form corresponding digitized current and voltage signals.

As described above, certain embodiments may monitor the terminal voltage of one or more phases of electrical power generated by an electrical generator. Sensor component 750 may be configured to perform this task. Further, sensor component 750 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, and the like.

ND converter 718 may be connected to processor 724 by way of a bus 742, through which digitized representations of current and voltage signals may be transmitted to processor 724. In various embodiments, the digitized current and voltage signals may be compared against conditions. For example, certain conditions may be established in order to implement one or more control actions based upon a determination that a power angle exceeds a threshold. The control action may include an instruction to reduce the load connected to the generator (e.g., by load shedding) or an instruction to increase generation capacity.

A monitored equipment interface 729 may be configured to receive status information from, and issue control instructions to a piece of monitored equipment. As discussed above, control actions may be issued when the power angle of a generator is outside of an acceptable range in order to cause the power angle to return to the acceptable range. Monitored equipment interface 729 may be configured to issue control instructions to one or more pieces of monitored equipment. According to some embodiments, control instructions may also be issued via network interface 732. Control instructions issued via network interface 732 may be transmitted, for example, to other IEDs (not shown), which in turn may issue the control instruction to a piece of monitored equipment. Alternatively, the piece of monitored equipment may receive the control instruction directly via its own network interface.

Computer-readable storage medium 726 may be the repository of one or more modules and/or executable instructions configured to implement certain functions described herein. For example, a signal module 752 may be configured to generate or analyze a reference signal and/or a rotational position signal. Signal module 752 may further be configured to detect a relative shift between the reference signal and the rotational position signal. The rotational position module 753 may be configured to determine the rotational position of the rotor based upon the relative shift between the reference signal and the rotational position signal. Further, the rotational position module 753 may be configured to determine whether the rotational position is within an acceptable range. The determination of whether the rotational position is within an acceptable range may be used to determine when control actions are to be implemented in order to cause the rotational position to return to the acceptable range. Control instruction module 754 may be configured to issue appropriate control instructions in order to maintain the electrical generator within the acceptable range or to cause the rotational position to return to the acceptable range. Communication module 755 may facilitate communication between IED 700 and other IEDs (not shown) via network interface 732. In addition, communication module 755 may further facilitate communication with monitored equipment in communication with IED 700 via monitored equipment interface 729 or with monitored equipment in communication with IED 700 via network interface 732. Finally, generator modeling module 756 may be configured to use the power angle information to develop a model of the generator. The model may, for example, include the ability to model the reactance of the generator.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

The invention claimed is:

1. An intelligent electronic device (IED) configured to determine a power angle of an electrical generator based on the rotational position of a rotor, comprising:
   a communications port;
   control logic communicatively coupled to the communications port, the control logic configured to:
      generate a reference signal;
      generate a sinusoidal waveform rotational position signal based upon an indicator of a rotational position of a rotor in an electrical generator;
      detect a relative shift between the reference signal and the sinusoidal waveform rotational position signal;
      calculate a power angle of the electrical generator using the relative shift between the reference signal and the sinusoidal waveform rotational position signal; and
      transmit an indication of the power angle via the communications port.

2. The IED of claim 1, further comprising a monitored equipment interface communicatively coupled to the control logic configured to receive status information from a piece of monitored equipment.

3. The IED of claim 2, wherein the monitored equipment interface is configured to receive an input from a magnetic pickup unit (MPU) configured to detect passage of a plurality of teeth associated with a tooth wheel coupled to the rotor of the electrical generator; and
   wherein the rotational position signal is based on the input from the MPU.

4. The IED of claim 3, wherein the rotational position signal is indistinguishable based on the angular position of the indicator of the rotational position.

5. The IED of claim 3, wherein the teeth of the tooth wheel are each substantially uniform.

6. The IED of claim 2, wherein the monitored equipment interface is configured to receive an input from a Hall-Effect sensor configured to detect passage of a plurality of teeth associated with a tooth wheel coupled to the rotor of the electrical generator; and
   wherein the rotational position signal is based on the input from the MPU.

7. The IED of claim 1, further comprising
   an external time input communicatively coupled to the control logic and configured to receive an external time signal.

8. The IED of claim 7, wherein the control logic is further configured to create a reference signal based upon an external time signal received via the external time input.

9. The IED of claim 1, further comprising a sensor component configured to monitor a terminal voltage of one phase of the electrical generator, and wherein the reference signal comprises the terminal voltage.

10. The IED of claim 1, wherein the control logic is further configured to: determine that the power angle exceeds a threshold; and generate a control instruction to reduce the power angle.

11. The IED of claim 10, wherein the control instruction comprises one of an instruction to reduce the load connected to the generator, and an instruction to increase generation capacity.

12. A method of determining a rotational position of a rotor in an electrical generator, comprising:
   generating a sinusoidal waveform rotational position signal based upon an indicator of a rotational position of a rotor in an electrical generator;
   generating a reference signal;
   detecting a relative shift between the reference signal and the indicator of the rotational position;
   calculating a power angle of the electrical generator using the relative shift between the reference signal and the sinusoidal waveform rotational position signal; and
   transmitting an indication of the power angle via a communications port.

13. The method of claim 12, wherein generating the reference signal comprises operating the generator in a no-load condition.

14. The method of claim 13, wherein determining the relative shift comprises:
   connecting the generator to a load; and
   comparing the reference signal in the no-load condition to the indicator of the rotational position in a loaded condition.

15. The method of claim 13, further comprising:
   determining that the phase shift exceeds a threshold; and
   generating a control instruction to reduce the phase shift.

16. The method of claim 15, wherein the control instruction comprises one of an instruction to reduce the load connected to the generator, and an instruction to increase generation capacity connected to the load.

17. The method of claim 13, wherein calculating the rotational position of the rotor comprises:
   detecting a zero crossing of the reference signal;
   detecting a zero crossing of the terminal voltage; and
   determining a time difference between the zero crossing of the reference signal and a zero crossing of the terminal voltage.

18. The method of claim 13, wherein operating the generator in a no-load configuration comprises selectively removing an exciter voltage operable to induce a magnetic field in the rotor.

19. The method of claim 12, wherein the reference signal comprises a signal generated based upon an external time signal.

20. The method of claim 12, wherein the reference signal comprises a phase of the terminal voltage of the electrical generator.

21. The method of claim 12, wherein the indicator of the rotational position comprises a tooth wheel coupled to the shaft of the rotor.

22. The method of claim 21, wherein the rotational position signal is indistinguishable based on the angular position of the indicator of the rotational position.

23. The method of claim 12, wherein the teeth of the tooth wheel are each substantially uniform.

24. A method for developing a model of an electrical generator performed by a system comprising a processor and a non-transitory computer-readable storage medium storing instructions that when executed by the processor cause the processor to perform the method, the method comprising:
   generating a sinusoidal waveform rotational position signal based upon an indicator of a rotational position of a rotor in an electrical generator;

generating a reference signal;
detecting a relative shift between the reference signal and the indicator of the rotational position;
calculating a power angle of the electrical generator using the relative shift between the reference signal and the sinusoidal waveform rotational position signal; and
determining a parameter of a model of the electrical generator based upon the calculated power angle.

* * * * *